(12) United States Patent
Gans

(10) Patent No.: US 6,725,316 B1
(45) Date of Patent: Apr. 20, 2004

(54) METHOD AND APPARATUS FOR COMBINING ARCHITECTURES WITH LOGIC OPTION

(75) Inventor: Dean D. Gans, Boise, ID (US)

(73) Assignee: Micron Technology, Inc., Boise, ID (US)

(*) Notice: Subject to any disclaimer, the term of this patent is extended or adjusted under 35 U.S.C. 154(b) by 586 days.

(21) Appl. No.: 09/640,740

(22) Filed: Aug. 18, 2000

(51) Int. Cl.[7] .......................... G06F 13/40; G06F 13/00; G06F 12/00
(52) U.S. Cl. .......................... 710/307; 710/33; 711/170; 711/171
(58) Field of Search .................... 710/307, 33; 711/170, 711/171

(56) References Cited

U.S. PATENT DOCUMENTS

| | | | |
|---|---|---|---|
| 4,667,305 A | * 5/1987 | Dill et al. | 710/307 |
| 4,989,185 A | 1/1991 | Matsuo et al. | |
| 5,165,037 A | * 11/1992 | Culley | 710/307 |
| 5,262,990 A | * 11/1993 | Mills et al. | 365/189.02 |
| 5,293,381 A | * 3/1994 | Choy | 370/476 |
| 5,394,528 A | * 2/1995 | Kobayashi et al. | 710/307 |
| 5,504,875 A | 4/1996 | Mills et al. | |
| 5,991,196 A | 11/1999 | Thomsen et al. | |
| 6,049,501 A | 4/2000 | Pantelakis et al. | |
| 6,463,031 B1 | * 10/2002 | Tran | 370/203 |

OTHER PUBLICATIONS

International Search Report dated Sep. 29, 2001.

* cited by examiner

*Primary Examiner*—Tim Vo
(74) *Attorney, Agent, or Firm*—Dickstein Shapiro Morin & Oshinsky LLP

(57) ABSTRACT

A method and apparatus is provided for selecting one of a plurality of data bus width configurations of a memory device using a logic circuit. The logic circuit includes a plurality of I/O circuits each connected to at least one of a plurality of memory arrays, and at least one address selection data path connected to at least one of the I/O circuits. A signal transmitted on the address selection data path selects one of a plurality of arrays from which to access data for each I/O circuit. When in a larger bus width configuration, each of the I/O circuits is connected to a data bus line. When in a smaller bus width configuration, a subset of the I/O circuits is connected to the data bus line and data from the plurality of memory arrays is output through the subset of I/O circuits, which selectively switch outputs between memory array inputs.

65 Claims, 8 Drawing Sheets

METHOD AND APPARATUS FOR COMBINING ARCHITECTURES WITH LOGIC OPTION

FIELD OF THE INVENTION

The present invention relates to a method and apparatus for combining different bus-width architectures of a memory device on a single semiconductor chip and, more particularly, to selecting one of a plurality of bus width configurations of a memory device using a logic option circuit.

BACKGROUND OF THE INVENTION

Memory subsystems for computers and other processor systems provide many memory devices on a common bus to allow larger storage and transmission capacities than can be obtained with a single memory device. In such systems, one or more integrated circuit chips contain the memory devices and permit connection of the memory devices to a data bus. The data bus facilitates the transmission of data between memory devices and other system components, for example a processor.

The data bus commonly consists of a finite number of data paths, the finite number usually being dubbed the "bus width." For most memory subsystems, the bus width is predetermined and fixed, meaning that each of the memory devices must be capable of transmitting and receiving data using a data bus of the predetermined bus width.

Due to the high cost of designing and developing integrated circuit chips, chip manufacturers often will design and produce a single chip having multiple architectures or configurations. Thus the same chip design may be mass-produced and used for a variety of applications, taking advantage of economies of scale and other cost-saving manufacturing techniques. For a chip of this type, after or near the end of fabrication the chip must be configured for use with its intended application.

For chips containing memory devices, a common parameter that varies between applications is the data bus width of the memory subsystem. Some exemplary memory subsystems use a data bus width of 18 bits, others 36 bits, and still others 72 bits. However, these exemplary values are not required and any number of bits may be used for the data bus width. In order to mass-produce memory devices capable of use in a variety of systems having different bus widths, chip manufacturers will often design and fabricate a single chip capable of transmitting and receiving data using one of several bus width configurations. For example, a single chip may be designed to interact with a data bus having a bus width of either 72 bits or 36 bits, depending on the way the chip is configured following fabrication.

The technique used to configure a chip capable of multiple configurations is often termed an "option." Exemplary conventional options include "bond", "via" and "metal" options. The bond, via and metal options each involve different methods of hard-wiring a memory device so that certain logic circuits and data paths are activated to cause the chip to function according to the chosen configuration. For example, a laser option may involve blowing laser fuses on the chip to activate those portions of the chip circuitry that cause the memory devices on the chip to function correctly when connected with a data bus having a width of 36 bits. As another example, a typical metal option may include depositing a small amount of conductive metal in specific locations on the chip to form electrical connections sufficient to cause the memory devices on the chip to function correctly when connected to a data bus having a width of 72 bits.

Bond, via and metal options typically involve adding gates and/or multiplexing circuits in paths where speed of data throughput is critical to the operation of the memory device. The gates and/or multiplexing units usually impose a speed penalty, making their use less desirable. Also, bond, via and metal options often are irreversible, meaning that once the decision is made to use one configuration, the chip may not thereafter be re-configured for use in a different application. In addition, via and metal options usually require that configuration decisions be made at the end of fabrication or immediately following fabrication of the chip, reducing user control of configuration options and thus reducing flexibility.

Therefore, there is a strong desire and need to develop a design for a memory device option that allows user configuration of the bus width at any time, the ability to easily reverse the option that is applied, while imposing a minimum speed penalty.

SUMMARY OF THE INVENTION

The present invention provides an apparatus and method for selecting one of a plurality of data bus width configurations of a memory device using a logic circuit. The logic circuit permits reversible selection of one of the available bus width configurations by a user or by the memory subsystem using specialized steering logic circuits and a data path for selecting among the available bus widths. This specialized steering logic circuitry may be embedded in the sense amplification circuitry of a memory device to minimize any speed penalty imposed on critical data paths.

The apparatus and method of the invention includes using a plurality of I/O circuits each connected to at least one of a plurality of memory arrays, and at least one address selection data path connected to at least one of the I/O circuits, wherein memory array data is accessed through a subset of the I/O circuits or though all of the I/O circuits, depending on the desired bus width. For a larger bus width, output paths for each of the I/O circuits are connected to bus lines of the memory system data bus. For a smaller bus width, only the output paths of a subset of the I/O circuits are connected to the bus lines of the memory system data bus.

In one aspect of the invention, a logic circuit is provided wherein a first data bus width may be used to access memory array data through the plurality of I/O circuits when a first selection signal is received on the address selection data path, and a second data bus width may be used to access memory array data through the plurality of I/O circuits when a second selection signal is received on the address selection data path.

In another aspect of the invention, a logic circuit is provided wherein each of the I/O circuits includes data paths for accessing data of more than one of the memory arrays and a select logic unit that indicates which of the more than one memory arrays should be accessed by the I/O circuit. The select logic unit includes an input select logic data path for user or system selection of which of the more than one memory arrays should be accessed by the I/O circuit.

In another aspect of the invention, a logic circuit is provided wherein the plurality of I/O circuits includes first and second I/O circuits, the first I/O circuit being connected to access data in a first memory array, the second I/O circuit being connected to access data in a second memory array or in the first memory array, the input select logic data path of the first I/O circuit selecting for output data from the first memory array and the input select logic data path of the second I/O circuit being connected to the address selection data path for selective output of data from the first memory array or the second memory array.

In another embodiment, a logic circuit is provided wherein the plurality of I/O circuits includes first and second I/O circuits, the first I/O circuit being connected to access data in a first memory array, the second I/O circuit being connected to access data in a second memory array or in the first memory array through the first I/O circuit, the input select logic data path of the first I/O circuit selecting for output data from the first memory array and the input select logic data path of the second I/O circuit being connected to the address selection data path for selective output of data from the first memory array or the second memory array. Data from the first memory array may therefore be output by the first I/O circuit or by the second I/O circuit after passing through the first I/O circuit.

In each of the embodiments described above, the first and second I/O circuits may be connected with a data bus of a fixed data bus width and the I/O circuits may be reversibly configured for use with that fixed data bus width. In a first, larger data bus width configuration, the address selection data path selects data from the second memory array for output from the second I/O circuit and both first and second I/O circuits are connected to the data bus. In a second, smaller data bus width configuration, the address selection data path sequentially selects data from the first and second memory arrays for output from the second I/O circuit, and only the second I/O circuit is connected to the data bus.

BRIEF DESCRIPTION OF THE DRAWINGS

These and other advantages and features of the invention will be more clearly understood from the following detailed description which is provided in connection with the accompanying drawings in which.

DETAILED DESCRIPTION OF THE PREFERRED EMBODIMENTS

The invention will now be described with reference to selecting a bus width configuration of a memory device. Conventional memory subsystems may be configured to use one or another of the available bus width configuration options using hardwired lines and multiplexers in the primary output data path, for example as shown in FIG. 1.

Figure 1:
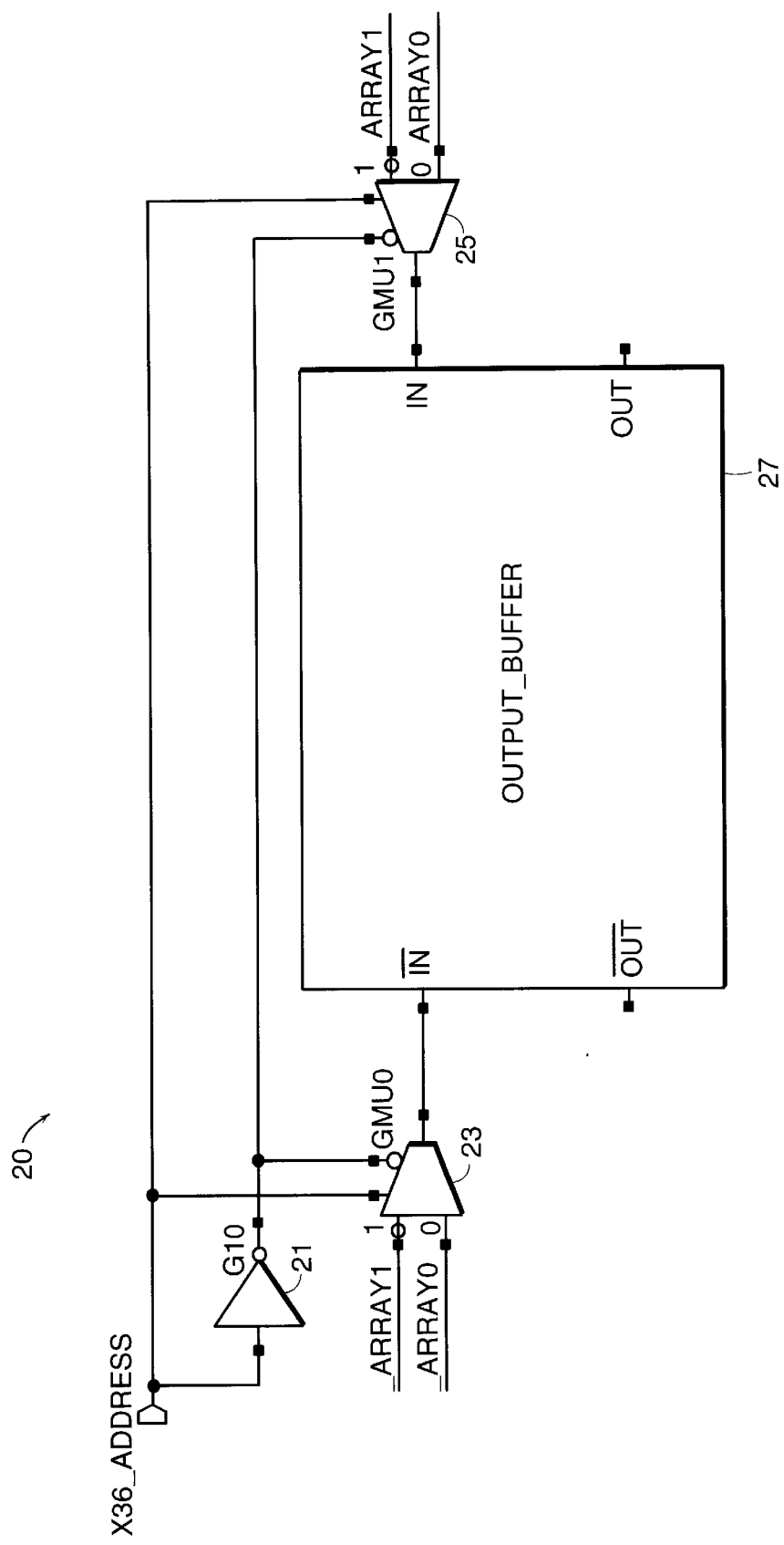
FIG. 1 illustrates a partial circuit diagram of a conventional option circuit for selecting a memory device configuration.

FIG. 1 illustrates an exemplary prior art option circuit 20. This option circuit 20 may conventionally appear within a memory device in at least one location on the output data path from the memory arrays. FIG. 1 shows a pair of multiplexers 23, 25, an output buffer 27, and an inverter 21, for switching the output of the memory device between data outputted from two different memory arrays, Array0 and Array 1. Based on the hardwired signal X36__Address, the output of the multiplexers 23, 25 will switch between (a) data from Array0 when X36__Address is low (digital "0"), and (b) data from Array1 when X36__Address is high (digital "1"). The output of the multiplexers is connected to the output buffer 27 to make the data of Array0 or Array1, depending on the signal X36__Address, available to the data bus attached to the memory device.

For example, in a conventional memory device having a bond, via or metal option, two of the circuits shown in FIG. 1 may be included in the data path between the memory arrays and the data bus. Each of the two FIG. 1 circuits would be connected to the memory arrays Array0 and Array1. To configure the memory device to use a first, larger bus width, the X36__Address data path of a first FIG. 1 circuit may be hardwired to high (digital "1") and the X36__Address data path of a second FIG. 1 circuit may be hardwired to low (digital "0"). In contrast, to configure the memory device to use a second, smaller bus width, the X36__Address data path of the first FIG. 1 circuit may alternate between high and low depending on which array data (i.e., data from array0 or array1) is desired to be output and the second FIG. 1 circuit may be neglected and not attached to the data bus. This hardwiring may be performed by blowing laser fuses (bond option), using metal interconnects (metal option), or other hardwiring techniques known in the art (e.g., via option).

In the preceding example, configuration to the first, larger bus width permits the first FIG. 1 circuit to transmit Array1 data to a first portion of the data bus (e.g., to the first 36 data paths) and the second FIG. 1 circuit to transmit Array0 data to a second portion of the data bus (e.g., to the second 36 data paths, for a final bus width of 72 data paths or bits). Configuration to the second, smaller bus width permits the first FIG. 1 circuit to transmit a multiplexed signal including data from both Array1 and Array0 the data bus (e.g., to the only 36 data paths or bits of the bus) and any remaining FIG. 1 circuits may be left unused.

In the examples just discussed, multiplexers 23, 25 are provided in the output data path of the memory arrays. The multiplexers impose a penalty on the speed of data output in that, for example for a READ operation of the memory device, the time required for the data to be transmitted from the array to the output buffer may be increased due to the additional incremental delays imposed by the multiplexer circuits.

In contrast to the conventional option circuit shown in FIG. 1, the present invention does not include a multiplexer in the data path. Instead, the invention uses steering logic embedded in the level translation and sense amplification circuitry. The steering logic of the present invention is simpler to implement than a multiplexer, imposes minimal incremental delays in the output data path, and improves the flexibility of the system using a minimum of additional circuit components.

Figure 2:
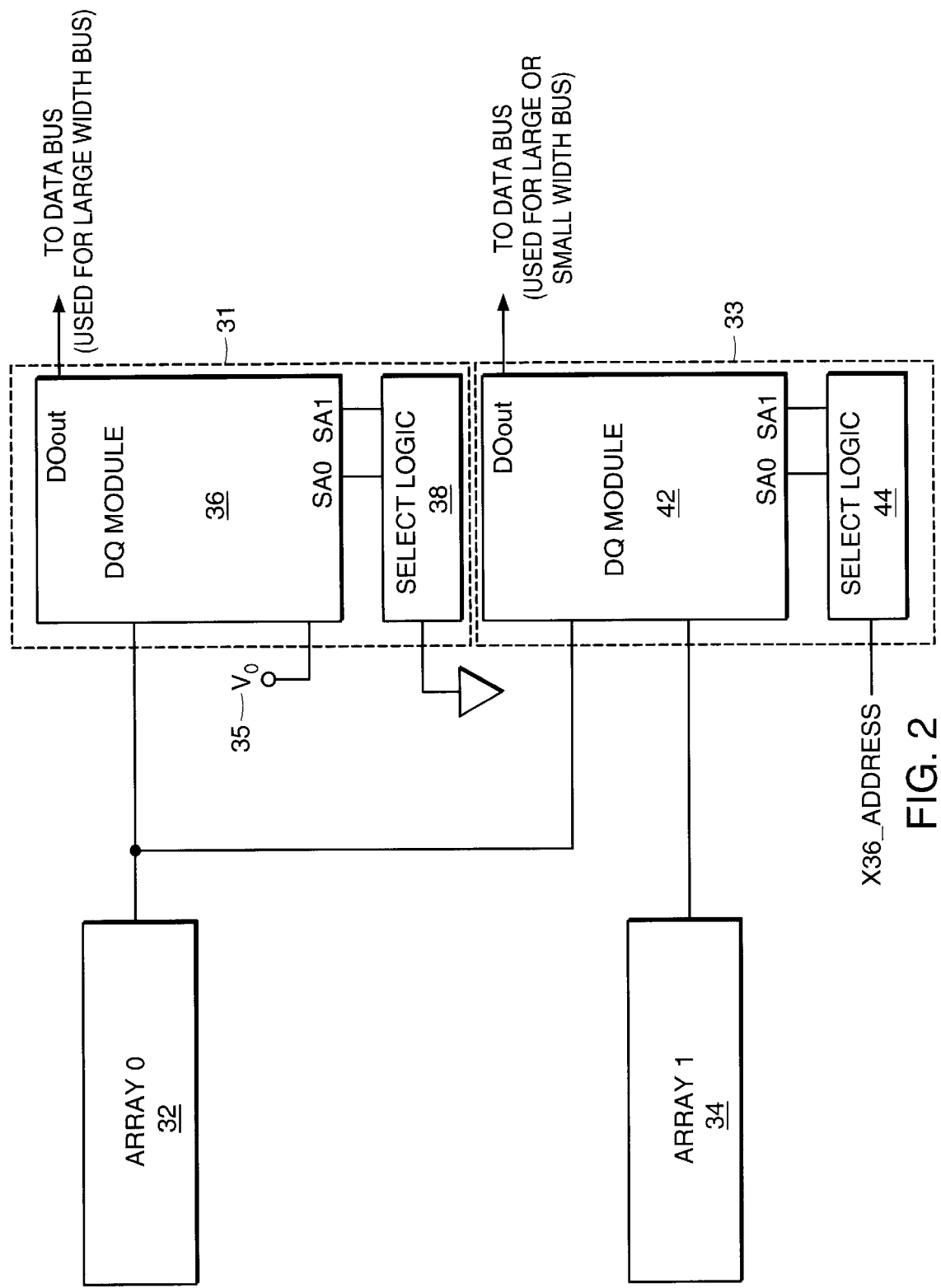
FIG. 2 illustrates a partial circuit diagram of a memory device implementing the circuit elements and configuration methodologies in accordance with the present invention.

FIG. 2 illustrates an exemplary partial circuit diagram of a logic circuit 30 formed in accordance with the present invention. FIG. 2 shows two memory arrays Array0 32 and Array1 34 of a memory device and two I/O circuits 31, 33 each having a respective sense amplification and level translation module 36, 42, and a respective select logic unit 38, 44. Each of the I/O circuits 31, 33 is identical and includes input data paths for connecting to two memory arrays. However, only the second I/O circuit 33 is connected to both memory arrays Array0 3and Array1 34. For example, the I/O circuit 31 is connected only to the memory array Array0 32, while the I/O circuit 33 is connected to both the memory arrays Array0 32 and Array1 34. The remaining input data paths to the first I/O circuit 31 are connected to a reference voltage 35.

The example shown in FIG. 2 permits two bus width configurations, where bus width refers to the number of data paths of the memory system data bus. To select the first, larger bus width configuration, the X36_Address input signal goes high. Then, the bus lines of the memory system data bus are connected to the DOout data paths of both of the I/O circuits 31, 33. To select the second, smaller bus width configuration, the X36_Address input signal may alternate between low and high values over time, depending on which memory array is currently selected to have its data output to the data bus. Then, the bus lines of the smaller width memory system data bus are connected to the DOout data paths of the second I/O circuit 33 only.

Figure 8:
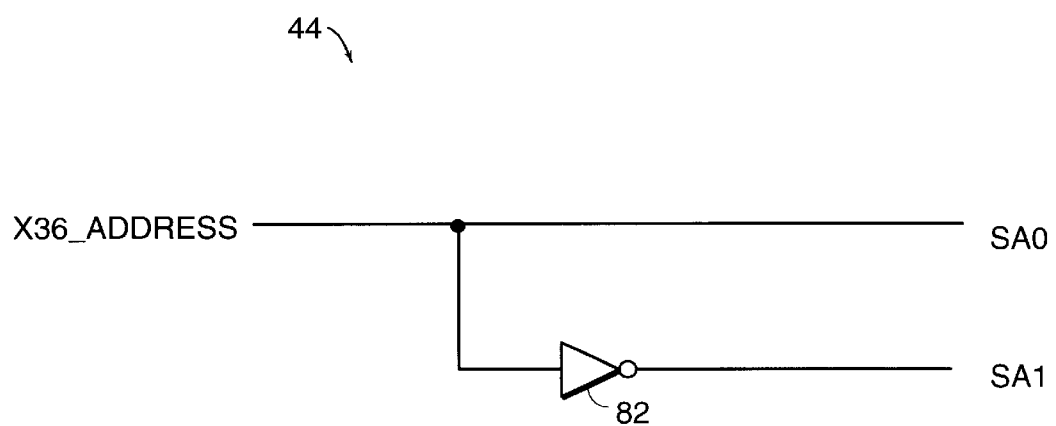
FIG. 8 illustrates a partial circuit diagram of a portion of the circuit of FIG. 2.

The select logic units 38, 44 each have an input select logic data path. The input select logic data path of select logic unit 44 is connected to the user- or system-controlled input signal X36_Address, and the input select logic data path for select logic unit 38 is connected to ground (i.e., it is hardwired low (digital "0")). The X36_Address signal is used to select a data bus width configuration of the memory device. The select logic units 38, 44 may include simple circuit elements that translate a single input selection signal into a plurality of control signals for controlling p-channel transistors (described below in connection with FIG. 4), one per available data array. FIG. 8 shows one implementation of an exemplary select logic unit 44.

FIG. 8 shows a simple implementation of an exemplary select logic unit 44 in which the input select logic data path is connected to X36_Address. The output of the select logic unit 44 is SA0 and SA1, each of which digitally indicates whether the corresponding memory array data is selected for output from the respective I/O Circuit 31, 33. In the exemplary implementation of FIG. 8, SA0 is simply the input X36_Address signal, while SA1 is the same signal passed through an inverter 82. This implementation allows for selection of only one of the memory arrays for output at a time from the I/O Circuit 31, 33.

The output signals SA0 and SA1 controls the gates of p-channel transistors (see p-channel transistors 78 described below in connection with FIG. 4). For example, when the input signal X36_Address is low (digital "0"), the output signal SA0 is deactivated low (digital "0") and the output signal SA1 is simultaneously transmitted high (digital "1"). On the other hand, when the input signal X36_Address is high (digital "1"), the output signal SA1 is deactivated low (digital "0") and the output signal SA0 is simultaneously transmitted high (digital "1").

Figure 3:
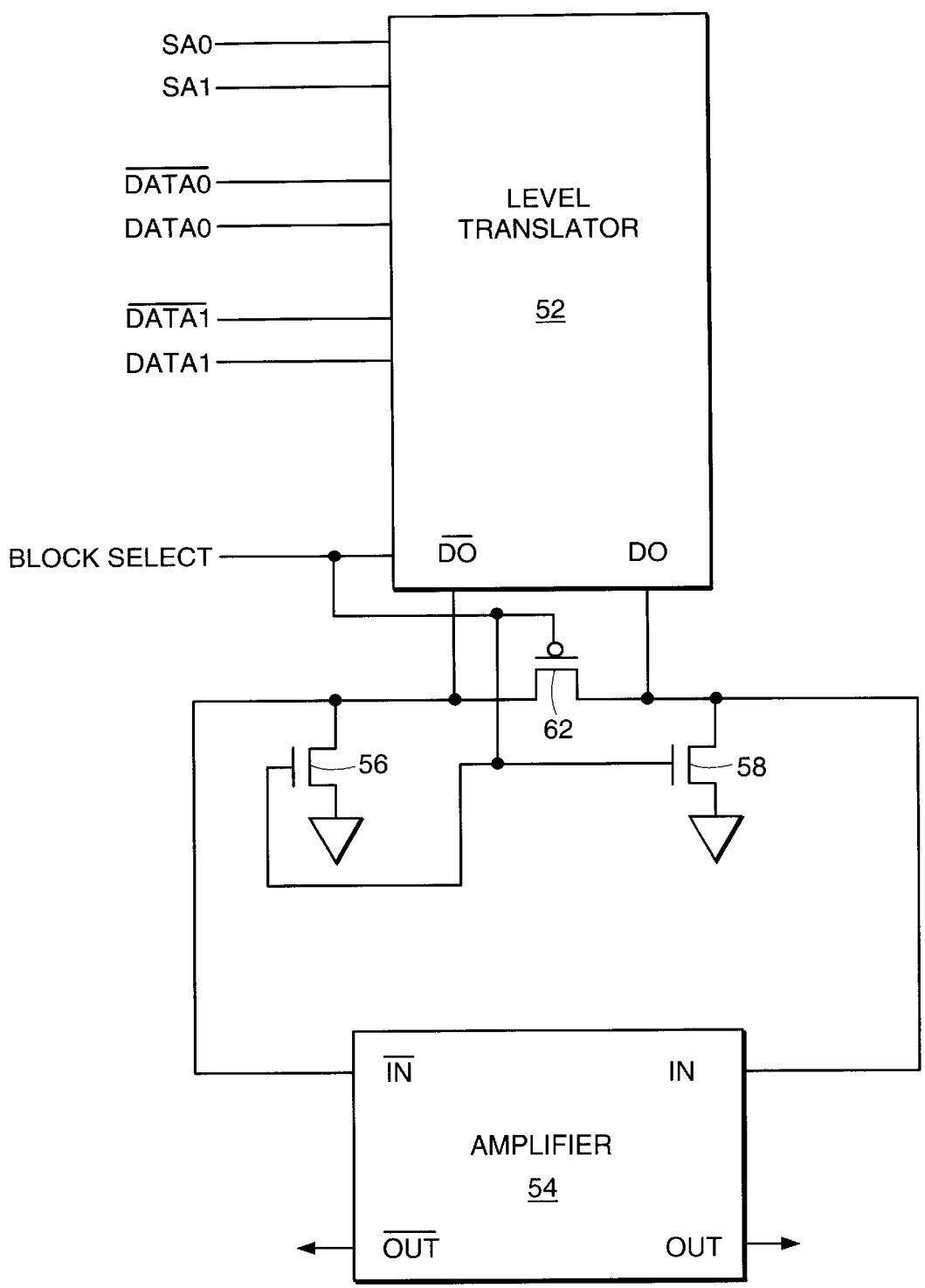
FIG. 3 illustrates a partial circuit diagram of a portion of the circuit of FIG. 2.

FIG. 3 illustrates circuitry included in each of the sense amplification and level translation modules 36, 42. Input data paths to the modules 36, 42 are connected to level translator circuit 52 which is connected to the sense amplifier circuit 54. Simple BlockSelect circuitry 56, 58, 62 activates the output when the memory system commands operation of the memory device. The BlockSelect circuitry 56, 58, 62 activates the output data paths when the BlockSelect signal is activated high (digital "1"), thus allowing memory array data to pass to the sense amplifier circuit 54.

The output data paths DO and /DO are differential signals, and hence are deactivated when the signal DO and its complement /DO are connected to each other (e.g., when the gate of the p-channel transistor 62 is not activated). The BlockSelect signal and associated circuitry are included to illustrate the differential nature of the data signals.

Figure 4:
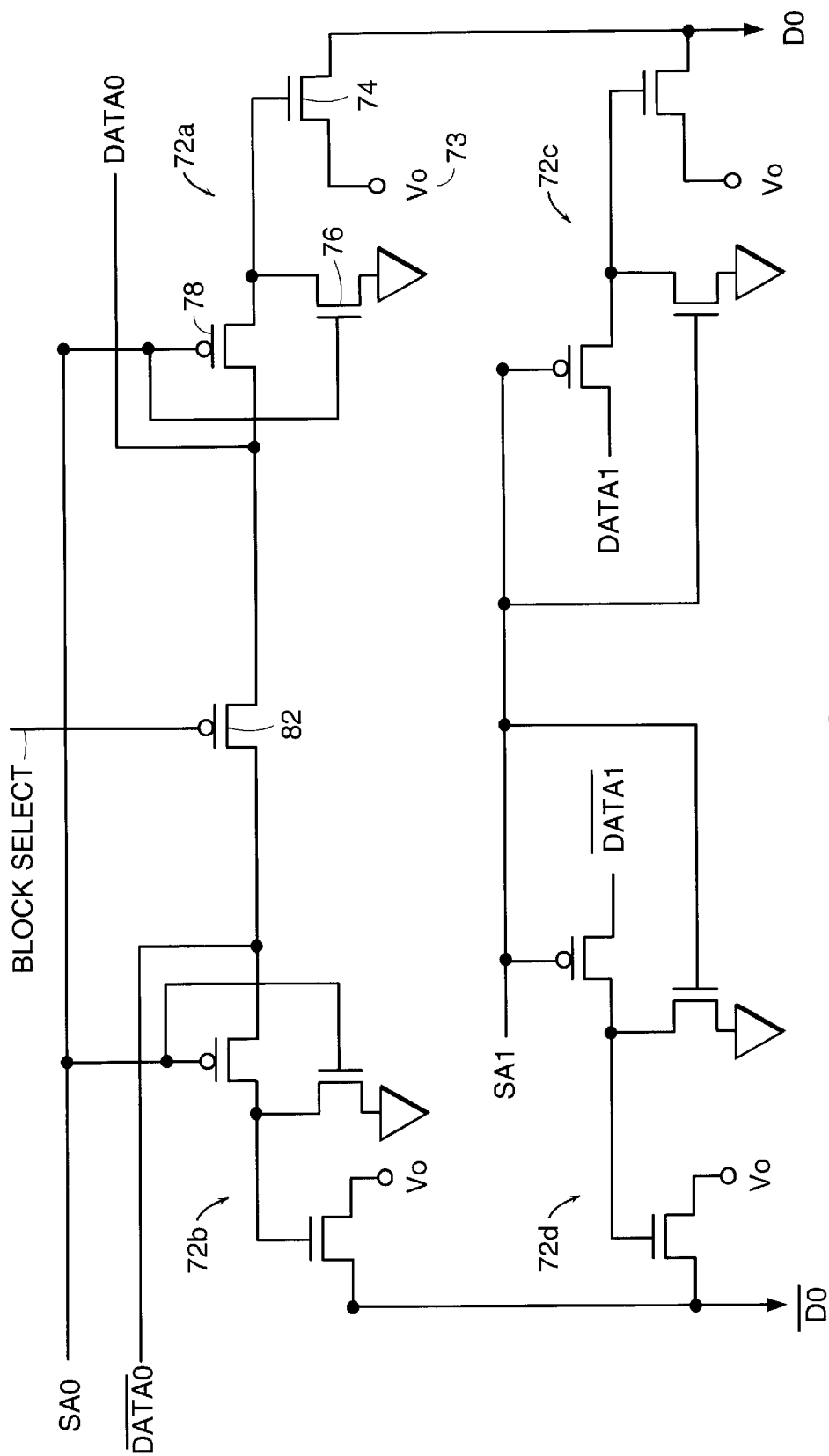
FIG. 4 illustrates a partial circuit diagram of a portion of the circuit of FIG. 3.

The level translator circuit 52 is illustrated in FIG. 4. FIG. 4 shows a plurality of level converters 72a . . . 72d corresponding to respective data paths for each memory array Array0 32 and Array1 34. Each of the level converters 72a . . . 72d converts the data transmitted on a respective memory array data path into a voltage level suitable for transmission to the sense amplifier 54 and eventual output to the data bus. Each level converter includes three transistors 74, 76, 78 connected as shown in FIG. 4. BlockSelect circuitry also appears in the level translator circuit 52 to activate the output.

For example, in level converter 72a, Wien SA0 is deactivated low, the gate of p-channel transistor 78 is activated, causing the data from Array0 (data0) to be transmitted to the n-channel transistors 74, 76. Simultaneously, the gate of n-channel transistor 76 is deactivated by the low state of the SA0 signal, so the data path of Array0 is disconnected from ground. Instead, the data bits from Array0 (data0) control the gate of n-channel transistor 74. When the gate of n-channel transistor 74 is alternately activated or deactivated by the data values (digital "0" or "1") in the Array0 data (data0), a reference voltage 73 is alternately connected to or disconnected from the output data path DO. In this way, the data in the selected data path is translated from the voltage level of the array output data path to the voltage level of the reference voltage 73. The data1 data path operates in a similar manner in response to the SA1 signal. Each of the level converters 72a . . . 72d operate in this manner to convert the output data from the memory arrays (e.g., data0 and data1).

The embodiment of FIGS. 2–4 and 8 permits the output of data from the memory arrays Array0 32 and Array1 34 through both of the I/O circuits 31, 33 or through the I/O circuit 33 only, depending on the desired bus width configuration of the memory device. The I/O circuit 33 is connected to both memory arrays Array0 32 and Array1 34, but in the larger bus width configuration, it outputs data from only Array0 34. Each of the I/O circuits 31, 33 contains level converters 72a . . . 72d which permit it to switch the output between inputs (e.g., from one array to another).

Figure 5:
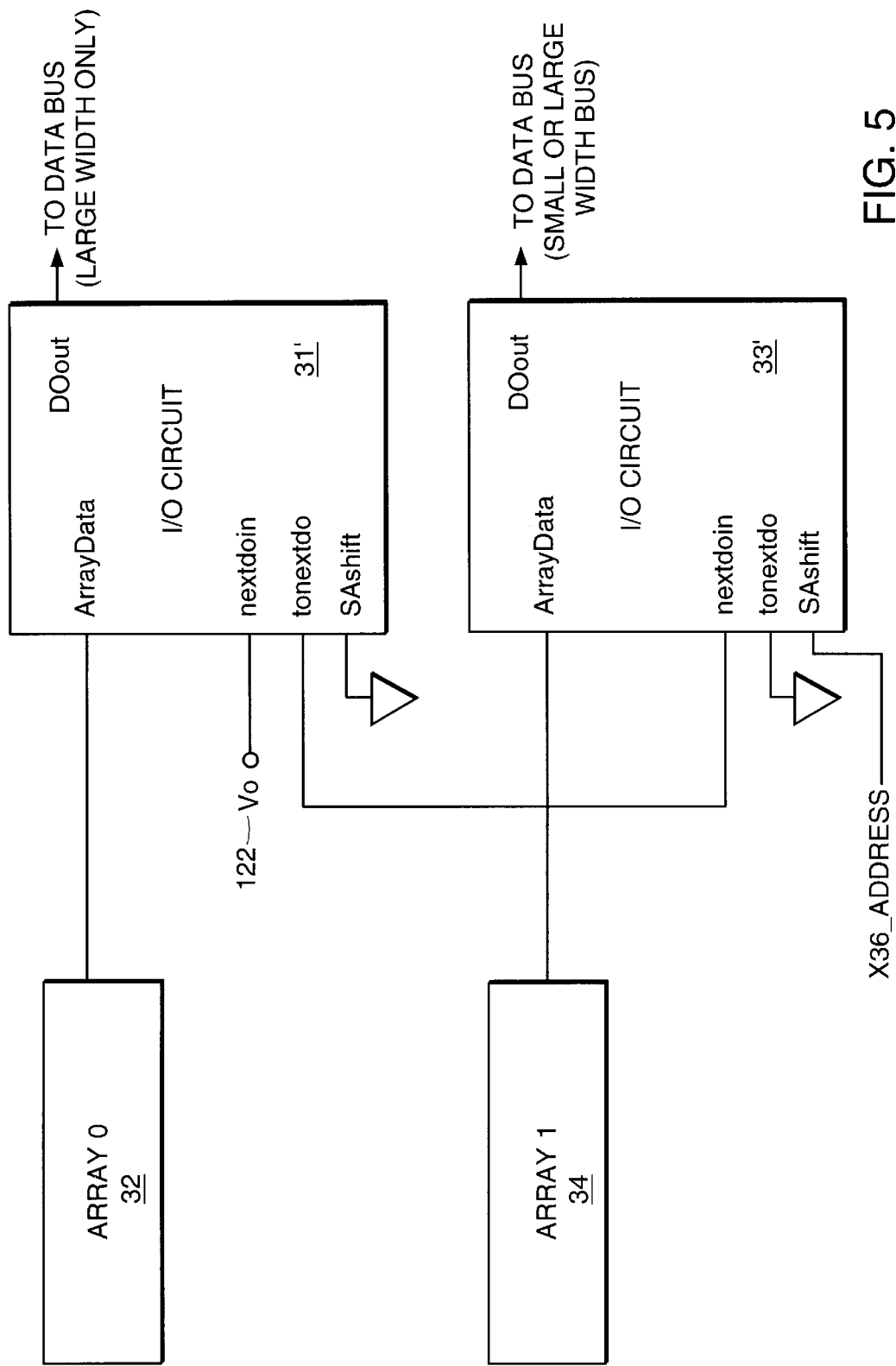
FIG. 5 illustrates a partial circuit diagram of a memory device implementing the circuit elements and configuration methodologies in accordance with an alternate embodiment of the present invention.

FIG. 5 illustrates a partial circuit diagram of an alternate embodiment of the present invention. Similar to the first embodiment, the embodiment shown in FIG. 5 includes memory arrays Array0 32 and Array1 34, as well as I/O circuits 31', 33'. Each of the I/O circuits 31', 33' include input data paths for connecting to a single memory array. For example, the I/O circuit 31' is connected to the memory array Array0 32, and the I/O circuit 33' is connected to the memory array Array1 34.

The I/O circuits 31', 33' also have data paths for passing data from its respective memory array to another I/O circuit 33', 31'. For example, as shown in FIG. 5 each of the I/O circuits 31', 33' have data paths "nextdoin" and "tonextdo." The nextdoin data path is an input data path for inputting array data passed through another I/O circuit. The tonextdo data path is an output data path for outputting array data to another I/O circuit.

In FIG. 5, the I/O circuits 31', 33' are interconnected, the tonextdo path of the first I/O circuit 31' being connected to the nextdoin path of the second I/O circuit 33'. This interconnection allows data from Array0 32 to be passed through the first I/O circuit 31' to the second I/O circuit 33'. This allows the second I/O circuit 33' to output data from either Array0 32 or Array1 34.

The example shown in FIG. 5 permits two bus width configurations. To select the first, larger bus width configuration, the X36_Address input signal is forced low and the bus is connected to the DOout data paths of both of the I/O circuits 31' and 33'. To select the second, smaller bus width configuration, the X36_Address input signal varies between low and high values over time, depending on which memory array should have its data output to the data bus, and the bus is connected to the DOout data paths of the second I/O circuit 33' only.

Figure 6:
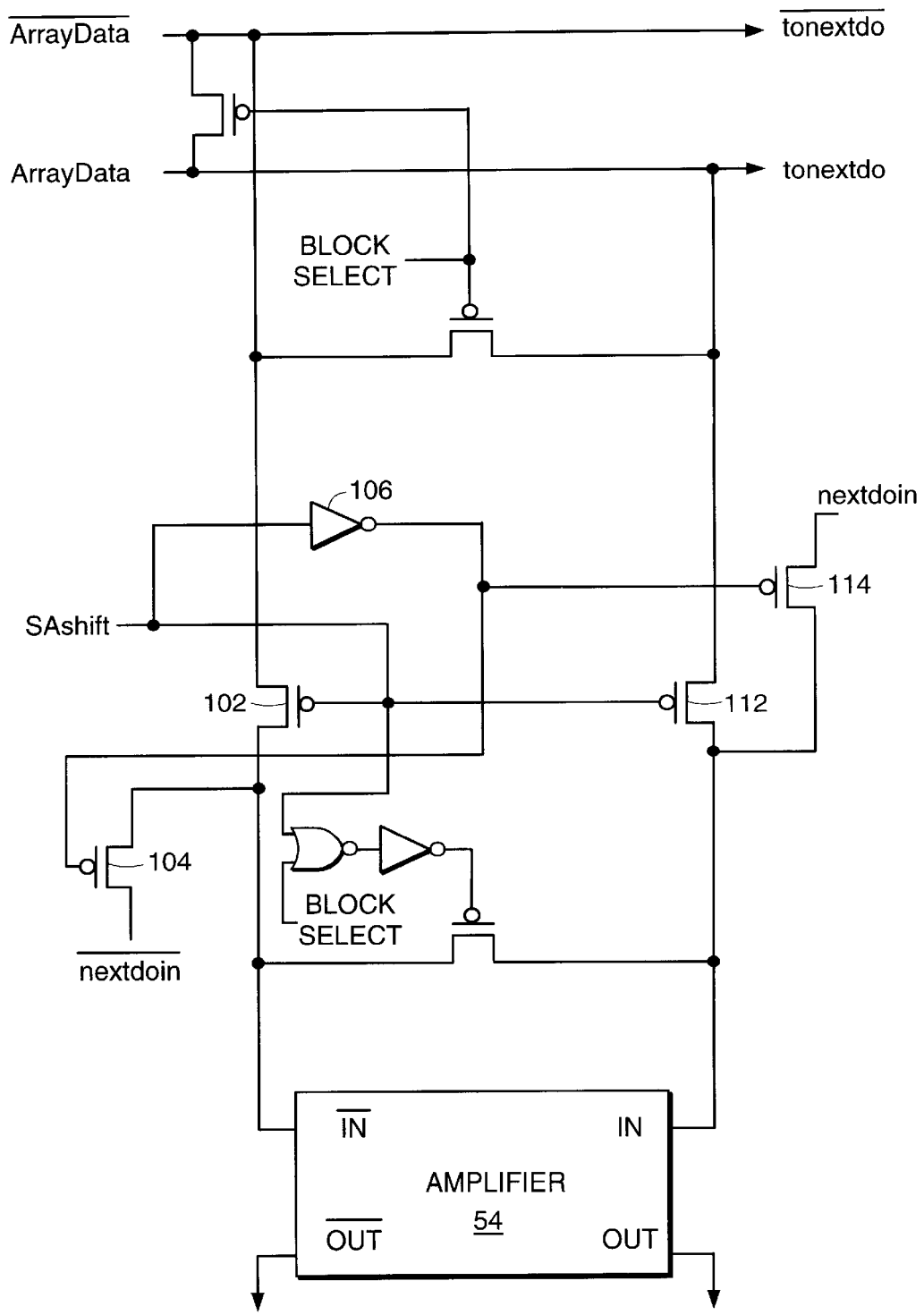
FIG. 6 illustrates a partial circuit diagram of a portion of FIG. 5.

Each of the I/O circuits 31', 33' is identical and includes the circuit elements shown in FIG. 6. The SAshift data path is connected to the gate of the p-channel transistors 102, 112 and, through an inverter 106, to the gate of the p-channel transistors 104, 114. Simple BlockSelect circuitry is again included to activate the output when the I/O circuit is selected for operation.

When SAshift is set low (digital "0"), the p-channel transistors 102, 112 connect the memory array data path ArrayData to the sense amplifier 54 for output to the data bus. Alternatively, when the SAshift signal is set high (digital "1"), the output of the inverter 106 causes the p-channel transistors 104, 114 to connect the "nextdoin" data path to the sense amplifier 54 for output to the data bus.

As shown in FIG. 5, the "nextdoin" data path for the second I/O circuit 33' is connected to the "tonextdo" data path of the first I/O circuit 31'. As shown in FIG. 6, the "tonextdo" a path for each I/O circuit 31', 33' is connected to the ArrayData data path. Thus, the nextdoin data path of the second I/O Circuit 33' is connected to the output data path of Array0 32. Because the SAshift data path of the second I/O Circuit 33 is connected to the X36_Address signal, the output of the second I/O circuit 33' may alternate between the output of the memory arrays Array0 32 and Array1 34 as the X36_Address signal varies between a high and low value.

However, also as shown in FIG. 5, the "nextdoin" data path of the first I/O circuit 31' is connected to a reference voltage 122, thus the first I/O circuit 31' may not be used to alternate between memory arrays. The I/O Circuit 31' may be used to output data from memory array Array0 32 only, whether the memory device is configured in the first, larger bus width configuration (e.g., the data of Array0 32 is passed to the data bus directly) or in the second, smaller bus width configuration (e.g., the data of Array0 32 is passed to the second I/O circuit 33').

Figure 7:
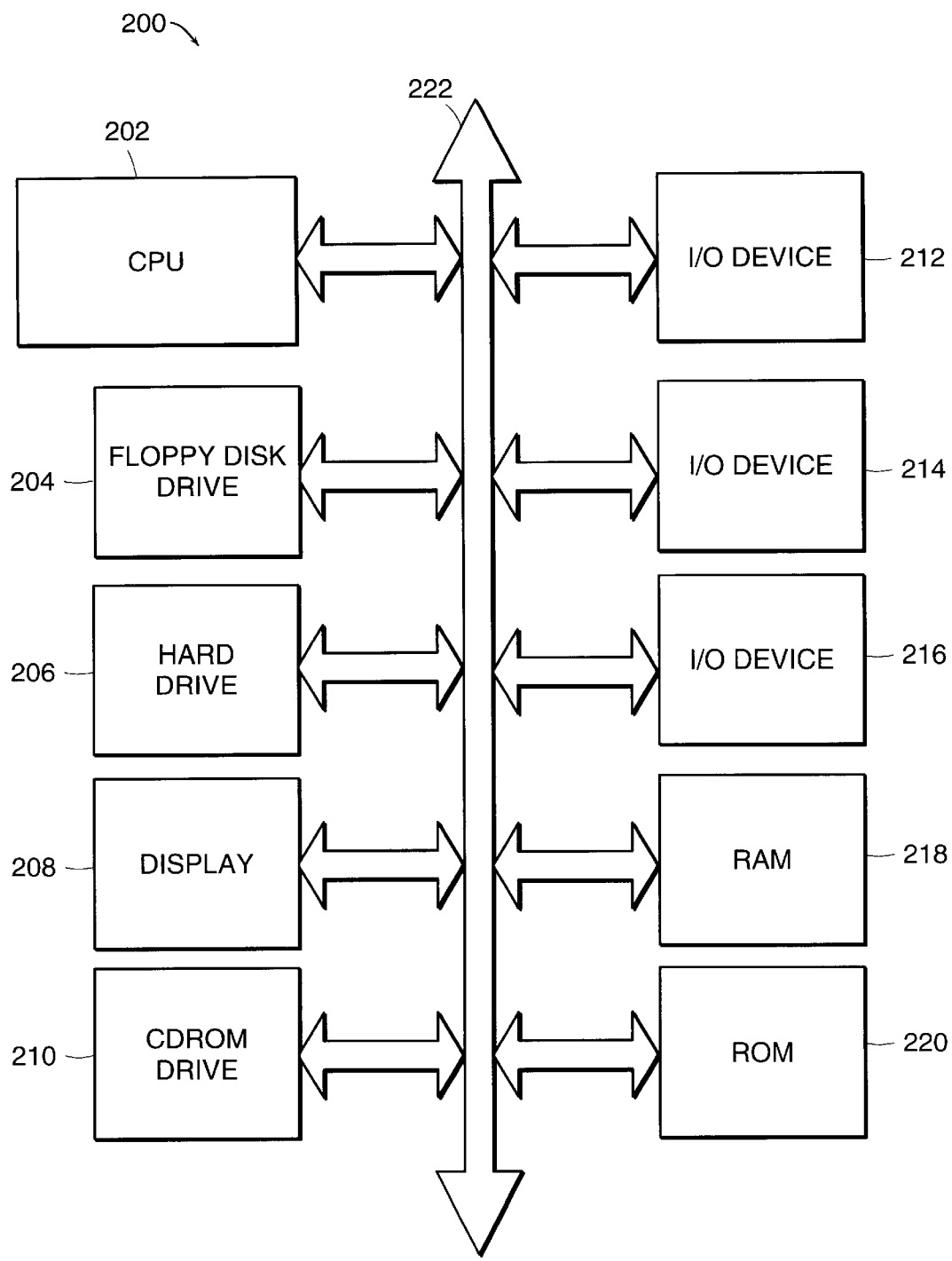
FIG. 7 illustrates a processor system that uses configuration methodologies and circuit elements in accordance with the invention.

FIG. 7 illustrates a processor system which employs logic circuits and selection methodologies in accordance with the method and apparatus of the invention.

As shown in FIG. 7, a processor based system, such as a computer system 200, for example, generally comprises a central processing unit (CPU) 202, for example, a microprocessor, that communicates with one or more input/output (I/O) devices 212, 214, 216 over a system bus 222. The system bus 222 may or may not include the memory subsystem data bus referenced earlier with respect to the I/O Circuits 31, 33. The computer system 200 also includes random access memory (RAM) 218, a read only memory (ROM) 220 and, in the case of a computer system may include peripheral devices such as a floppy disk drive 204, a hard drive 206, a display 208 and a compact disk (CD) ROM drive 210 which also communicate with the processor 202 over the bus 222. The RAM 218 is preferably constructed with logic option selection circuitry which can be used to select a preferred memory subsystem data bus width configuration using the method and apparatus of the invention described above with reference to FIGS. 2–6 and 8.

In another embodiment of the invention, a memory system is provided including at least one or a plurality of memory devices constructed with logic option selection circuitry which can be used to select a preferred memory subsystem data bus width configuration using the method and apparatus of the invention described above with reference to FIGS. 2–6 and 8. Within the memory system, some or all of the plurality of memory devices may be arranged on at least one memory module. In a preferred configuration, the memory system would include a plurality of memory modules, each containing a plurality of memory devices constructed with logic option selection circuitry as described above with reference to FIGS. 2–6 and 8.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed is:

1. A logic circuit for outputting data from a memory device using one of a plurality of data bus width configurations, comprising:

a steering logic circuit for selectively outputting data from a plurality of memory arrays in at least one of first and second bus width configurations, wherein said data passes through said steering logic circuit when going from at least one of said plurality of memory arrays to at least one sense amplifier circuit; and a level translator provided between a memory array and said at least one sense amplifier circuit.

2. A logic circuit for outputting data from a memory device using one of a plurality of data bus width configurations, comprising:

a plurality of I/O circuits each connected to output data from at least one of a plurality of memory arrays and configurable for use with one of a plurality of data bus widths;

a level translator provided in a data path of said I/O circuits; and a circuit for selectively operating said first and second I/O circuits in said first and second bus width configurations such that in said first bus width configuration said first I/O circuit outputs data from said first memory array and said second I/O circuit outputs data from said second memory array, and in said second bus width configuration said first I/O circuit does not output data and said second I/O circuit outputs data from said first and second memory arrays.

3. A logic circuit as in claim 2 further comprising an address selection data path on which an address signal is transmitted to set said second I/O circuit to use one of said first and second bus width configurations.

4. A logic circuit as in claim 2 wherein a control signal is transmitted to said circuit that sets said second I/O circuit to use one of said first and second bus width configurations.

5. A logic circuit as in claim 2 wherein said first I/O circuit is connected to receive data from said first memory array and said second I/O circuit is connected to receive data from both said first and second memory arrays.

6. A logic circuit as in claim 2 wherein said first I/O circuit is connected to receive data from said first memory array and said second I/O circuit is connected to receive data from said second memory array and data from said first memory array through said first I/O circuit.

7. A logic circuit as in claim 2 wherein each of said I/O circuits includes a sense amplifier circuit for providing a data signal for a bus line.

8. A logic circuit as in claim 2 wherein said level translator further comprises a plurality of level converters each including a p-channel transistor connected to selectively connect a gate of an n-channel transistor with an associated array data input path, said n-channel transistor selectively connecting a reference voltage to a sense amplifier for selective output of translated data from one of said first and second memory arrays from a respective I/O circuit.

9. A logic circuit as in claim 3 wherein said signal is settable to a single selection value that causes said second I/O circuit to output data from said second memory array, or said signal is settable to switch between selection values causing said second I/O circuit to selectively output data from one of a selected said first and second memory arrays.

10. A logic circuit as in claim 3 wherein each of said I/O circuits includes circuit elements to selectively switch an output of said I/O circuit between first and second data inputs.

11. A logic circuit as in claim 5 wherein said single selection value is used when said logic circuit is configured to connect to a first data bus having a first, larger data bus width, and said switching selection value is used when said logic circuit is configured to connect to a second data bus having a second, smaller data bus width.

12. A logic circuit as in claim 10 wherein said circuit elements are selectively switched according to a selection value received on said address input data path.

13. A logic circuit as in claim 11 wherein said first data bus width is an integer multiple of said second data bus width.

14. A logic circuit as in claim 13 wherein said integer multiple is two (2).

15. A logic circuit as in claim 14 wherein said first data bus width is 72 bits and said second data bus width is 36 bits.

16. A memory system including a memory device having a settable bus width configuration, said memory device comprising:
   a steering logic circuit for selectively outputting data from a plurality of memory arrays in at least one of first and second bus width configurations, wherein said data passes through said steering logic circuit when going from at least one of said plurality of memory arrays to at least one sense amplifier circuit; and
   a level translator provided between a memory array and said at least one sense amplifier circuit.

17. A memory system including a memory device having a settable bus width configuration, said memory device comprising:
   a plurality of I/O circuits each connected to output data from at least one of a plurality of memory arrays and configurable for use with one of a plurality of data bus widths;
   a level translator provided in a data path of said I/O circuits; and
   a circuit for selectively operating said first and second I/O circuits in said first and second bus width configurations such that in said first bus width configuration said first I/O circuit outputs data from said first memory array and said second I/O circuit outputs data from said second memory array, and in said second bus width configuration said first I/O circuit does not output data and said second I/O circuit outputs data from said first and second memory arrays.

18. A memory system as in claim 17 further comprising a plurality of said memory devices.

19. A memory system as in claim 17 further comprising an address selection data path on which an address signal is transmitted to set said second I/O circuit to use one of said first and second bus width configurations.

20. A memory system as in claim 17 wherein a control signal is transmitted to said circuit that sets said second I/O circuit to use one of said first and second bus width configurations.

21. A memory system as in claim 17 wherein said first I/O circuit is connected to receive data from said first memory array and said second I/O circuit is connected to receive data from both said first and second memory arrays.

22. A memory system as in claim 17 wherein said first I/O circuit is connected to receive data from said first memory array and said second I/O circuit is connected to receive data from said second memory array and data from said first memory array through said first I/O circuit.

23. A memory system as in claim 17 wherein each of said I/O circuits includes a sense amplifier circuit for providing a data signal for a bus line.

24. A memory system as in claim 17 wherein said level translator further comprises a plurality of level converters each including a p-channel transistor connected to selectively connect a gate of an n-channel transistor with an associated array data input path, said n-channel transistor selectively connecting a reference voltage to a sense amplifier for selective output of translated data from one of said first and second memory arrays from a respective I/O circuit.

25. A memory system as in claim 18 wherein said plurality of said memory devices are included on a memory module.

26. A memory system as in claim 18 wherein said signal is settable to a single selection value that causes said second I/O circuit to output data from said second memory array, or said signal is settable to switch between selection values causing said second I/O circuit to selectively output data from one of a selected said first and second memory arrays.

27. A memory system as in claim 19 wherein each of said I/O circuits includes circuit elements to selectively switch an output of said I/O circuit between first and second data inputs.

28. A memory system as in claim 25 further comprising a plurality of said memory modules each including a respective plurality of said memory devices.

29. A memory system as in claim 26 wherein said single selection value is used when said logic circuit is configured to connect to a first data bus having a first, larger data bus width, and said switching selection value is used when said logic circuit is configured to connect to a second data bus having a second, smaller data bus width.

30. A memory system as in claim 27 wherein said circuit elements are selectively switched according to a selection value received on said address input data path.

31. A memory system as in claim 29 wherein said first data bus width is an integer multiple of said second data bus width.

32. A memory system as in claim 31 wherein said integer multiple is two (2).

33. A memory system as in claim 32 wherein said first data bus width is 72 bits and said second data bus width is 36 bits.

34. A processor system, comprising:
a processor; and
a memory system coupled to said processor through a bus system, said memory system containing a memory device having a settable bus width configuration, said memory device comprising:
   a steering logic circuit for selectively outputting data from a plurality of memory arrays in at least one of first and second bus width configurations, wherein said data passes through said steering logic circuit when going from at least one of said plurality of memory arrays to at least one sense amplifier circuit; and
   a level translator provided between a memory array and said at least one sense amplifier circuit.

35. A processor system, comprising:
a processor; and
a memory system coupled to said processor through a bus system, said memory system containing a memory device having a settable bus width configuration, said memory device comprising:
   a plurality of I/O circuits each connected to output data from at least one of a plurality of memory arrays and configurable for use with one of a plurality of data bus widths;
   a level translator provided in a data path of said I/O circuits; and
   a circuit for selectively operating said first and second I/O circuits in said first and second bus width configurations such that in said first bus width configuration said first I/O circuit outputs data from said first memory array and said second I/O circuit outputs data from said second memory array, and in said second bus width configuration said first I/O circuit does not output data and said second I/O circuit outputs data from said first and second memory arrays.

36. A processor system as in claim 35 further comprising an address selection data path on which an address signal is transmitted to set said second I/O circuit to use one of said first and second bus width configurations.

37. A processor system as in claim 35 wherein a control signal is transmitted to said circuit that sets said second I/O circuit to use one of said first and second bus width configurations.

38. A processor system as in claim 35 wherein said first I/O circuit is connected to receive data from said first memory array and said second I/O circuit is connected to receive data from both said first and second memory arrays.

39. A processor system as in claim 35 wherein said first I/O circuit is connected to receive data from said first memory array and said second I/O circuit is connected to receive data from said second memory array and data from said first memory array through said first I/O circuit.

40. A processor system as in claim 35 wherein each of said I/O circuits includes a sense amplifier circuit for providing a data signal for a bus line.

41. A processor system as in claim 35 wherein said level translator further comprises a plurality of level converters each including a p-channel transistor connected to selectively connect a gate of an n-channel transistor with an associated array data input path, said n-channel transistor selectively connecting a reference voltage to a sense amplifier for selective output of translated data from one of said first and second memory arrays from a respective I/O circuit.

42. A processor system as in claim 36 wherein said signal is settable to a single selection value that causes said second I/O circuit to output data from said second memory array, or said signal is settable to switch between selection values causing said second I/O circuit to selectively output data from one of a selected said first and second memory arrays.

43. A processor system as in claim 36 wherein each of said I/O circuits includes circuit elements to selectively switch an output of said I/O circuit between first and second data inputs.

44. A processor system as in claim 42 wherein said single selection value is used when said logic circuit is configured to connect to a first data bus having a first, larger data bus width, and said switching selection value is used when said logic circuit is configured to connect to a second data bus having a second, smaller data bus width.

45. A processor system as in claim 43 wherein said circuit elements are selectively switched according to a selection value received on said address input data path.

46. A processor system as in claim 44 wherein said first data bus width is an integer multiple of said second data bus width.

47. A processor system as in claim 46 wherein said integer multiple is two (2).

48. A processor system as in claim 47 wherein said first data bus width is 72 bits and said second data bus width is 36 bits.

49. A method of operating a memory device with a plurality of data bus width configurations, comprising:
selectively outputting data from a plurality of memory arrays in at least one of said plurality of data bus width configurations, wherein said selective output is performed using a steering logic circuit when said data is going from at least one of said plurality of memory arrays to at least one sense amplifier circuit, wherein a level translator included in said steering logic provides a differential input signal to said at least one sense amplifier circuit, said at least on sense amplifier outputting differential data on an output data path.

50. A method of operating a memory device with a plurality of data bus width configurations, comprising:
providing a differential input signal to at least one sense amplifier circuit, said at least one sense amplifier outputting differential data on an output data path;
outputting data from a first memory array through a first I/O circuit and from a second memory array through a second I/O circuit when a first bus width configuration is selected;
outputting data from a selected one of said first memory array and said second memory array through said second I/O circuit when a second bus width configuration is selected; and
setting said second I/O circuit to use one of said first and second data bus width configurations according to a control signal.

51. A method as in claim 50 further comprising receiving said control signal on an address selection data path connected to said second I/O circuit.

52. A method as in claim 50 wherein said control signal is settable to a single selection value that causes said second I/O circuit to output data from said second memory array, or said signal is settable to switch between selection values causing said second I/O circuit to selectively output data from one of a selected said first and second memory arrays.

53. A method as in claim 50 wherein said first I/O circuit receives data from said first memory array and said second I/O circuit receives data from both said first and second memory arrays.

54. A method as in claim 50 wherein said first I/O circuit receives data from said first memory array and said second I/O circuit receives data from said second memory array and data from said first memory array through said first I/O circuit.

55. A method as in claim 51 wherein each of said I/O circuits includes circuit elements to selectively switch an output of said I/O circuit between first and second data inputs.

56. A method as in claim 52 wherein said single selection value is used when said logic circuit is configured to connect to a first data bus having a first, larger data bus width, and said switching selection value is used when said logic circuit is configured to connect to a second data bus having a second, smaller data bus width.

57. A method as in claim 55 wherein said circuit elements are selectively switched according to a selection value received on said address selection data path.

58. A method as in claim 56 wherein said first data bus width is an integer multiple of said second data bus width.

59. A method as in claim 57 wherein said selection value received by said first I/O circuit is hardwired to indicate output of data from said first memory array, and said selection value received by said second I/O circuit may indicate output of data from said first memory array or said second memory array.

60. A method as in claim 58 wherein said integer multiple is two (2).

61. A method as in claim 60 wherein said first data bus width is 72 bits and said second data bus width is 36 bits.

62. A memory system including a memory device having a settable width configuration, said memory device comprising:
- a first and second I/O circuit, each connected to output data from at least one of a plurality of memory arrays and configurable for use with one of a first and second data bus width configurations;
- a circuit for selectively operating said first and second I/O circuits in said first and second bus width configurations such that in said first bus width configuration said first I/O circuit outputs data from said first memory array and said second I/O circuit outputs data from said second memory array, and in said second bus width configuration said first I/O circuit does not output data and said second I/O circuit successively outputs data from said first and second memory arrays; and
- a switching element for selectively operating of said first and second I/O circuits in said first and second bus width configurations in response to a selection value received on an address input data path; wherein first and second I/O circuits are interconnected such that in said second bus width configuration data from said first memory array passes through said first I/O circuit to said second I/O circuit.

63. A memory system as in claim 62 wherein said circuit elements include at least one inverter connected to invert said selection value, wherein said selection value selectively connects an array data input path with a sense amplifier and said inverted selection value selectively connects a pass-through array data path with said sense amplifier for selective output of data from one of said first and second memory arrays from a respective I/O circuit.

64. A processor system comprising:

a processor; and a memory system coupled to said processor through a bus system, said memory system containing a memory device having a settable bus width configuration, said memory device comprising:
- a first and second I/O circuit, each connected to output data from at least one of a plurality of memory arrays and configurable for use with one of a first and second data bus width configurations;
- a circuit for selectively operating said first and second I/O circuits in said first and second bus width configurations such that in said first bus width configuration said first I/O circuit outputs data from said first memory array and said second I/O circuit outputs data from said second memory array, and in said second bus width configuration said first I/O circuit does not output data and said second I/O circuit successively outputs data from said first and second memory arrays; and
- a switching element for selectively operating of said first and second I/O circuits in said first and second bus width configurations in response to a selection value received on an address input data path; wherein first and second I/O circuits are interconnected such that in said second bus width configuration data from said first memory array passes through said first I/O circuit to said second I/O circuit.

65. A processor system as in claim 64 wherein said circuit elements include at least one inverter connected to invert said selection value, wherein said selection value selectively connects an array data input path with a sense amplifier and said inverted selection value selectively connects a pass-through array data path with said sense amplifier for selective output of data from one of said first and second memory arrays from a respective I/O circuit.

* * * * *